(12) United States Patent
Chang et al.

(10) Patent No.: US 10,714,344 B2
(45) Date of Patent: Jul. 14, 2020

(54) MASK FORMATION BY SELECTIVELY REMOVING PORTIONS OF A LAYER THAT HAVE NOT BEEN IMPLANTED

(71) Applicant: Taiwan Semiconductor Manufacturing Co., Ltd., Hsinchu (TW)

(72) Inventors: Tien-Shun Chang, New Taipei (TW); Chun-Feng Nieh, Hsinchu (TW); Huicheng Chang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/665,139

(22) Filed: Oct. 28, 2019

(65) Prior Publication Data

US 2020/0058505 A1   Feb. 20, 2020

Related U.S. Application Data

(63) Continuation of application No. 15/920,745, filed on Mar. 14, 2018, now Pat. No. 10,460,940.

(51) Int. Cl.
*H01L 21/033* (2006.01)
*H01L 21/768* (2006.01)
(Continued)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/266* (2013.01); *H01L 21/3086* (2013.01); *H01L 21/31111* (2013.01); *H01L 21/31144* (2013.01); *H01L 21/32155* (2013.01); *H01L 21/426* (2013.01); *H01L 21/76802* (2013.01); *H01L 21/76825* (2013.01); *H01L 21/76895* (2013.01)

(58) Field of Classification Search
CPC ............. H01L 21/0332; H01L 21/0335; H01L 21/0337; H01L 21/0338; H01L 21/26506; H01L 21/26513; H01L 21/26586; H01L 21/266; H01L 21/30604; H01L 21/3086; H01L 21/31111; H01L 21/31144; H01L 21/32155; H01L 21/426; H01L 21/76802; H01L 21/76825
See application file for complete search history.

(56) References Cited

U.S. PATENT DOCUMENTS 8,772,102 B2   7/2014   Chi
9,852,983 B1   12/2017  Lee
(Continued)

*Primary Examiner* — Stephen W Smoot
(74) *Attorney, Agent, or Firm* — Slater Matsil, LLP

(57) ABSTRACT

Embodiments described herein relate generally to methods for forming a mask for patterning a feature in semiconductor processing. In an embodiment, a dielectric layer is formed over a substrate. A mask is formed over the dielectric layer. Forming the mask includes depositing a first layer over the dielectric layer; implanting in a first implant process a dopant species through a patterned material and into the first layer at a first energy; after implanting in the first implant process, implanting in a second implant process the dopant species through the patterned material and into the first layer at a second energy greater than the first energy; and forming mask portions of the mask comprising selectively removing portions of the first layer that are not implanted with the dopant species.

20 Claims, 17 Drawing Sheets

(51) Int. Cl.
*H01L 21/311* (2006.01)
*H01L 21/3215* (2006.01)
*H01L 21/266* (2006.01)
*H01L 21/308* (2006.01)
*H01L 21/426* (2006.01)

(56) References Cited

U.S. PATENT DOCUMENTS

| | | |
|---|---|---|
| 2009/0033362 A1 | 2/2009 | Manger et al. |
| 2009/0233448 A1 | 9/2009 | Cho et al. |
| 2013/0102136 A1 | 4/2013 | Hsieh et al. |
| 2019/0067299 A1 | 2/2019 | Huang et al. |

MASK FORMATION BY SELECTIVELY REMOVING PORTIONS OF A LAYER THAT HAVE NOT BEEN IMPLANTED

PRIORITY CLAIM AND CROSS-REFERENCE

This application is a continuation of U.S. application Ser. No. 15/920,745, filed on Mar. 14, 2018, which application is hereby incorporated herein by reference.

BACKGROUND

The integrated circuit (IC) industry has experienced rapid growth. Technological advances in IC design and material have produced generations of ICs where each generation has smaller and more complex circuits than previous generations. In the course of IC evolution, functional density (e.g., the number of interconnected devices per chip area) has generally increased while geometry size (e.g., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is mask fabrication. Although existing methods of fabricating IC devices have been generally adequate for their intended purposes, they have not been entirely satisfactory in all respects. For example, tolerances for variations of features in an IC in larger generations may not be acceptable in newer, smaller generations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
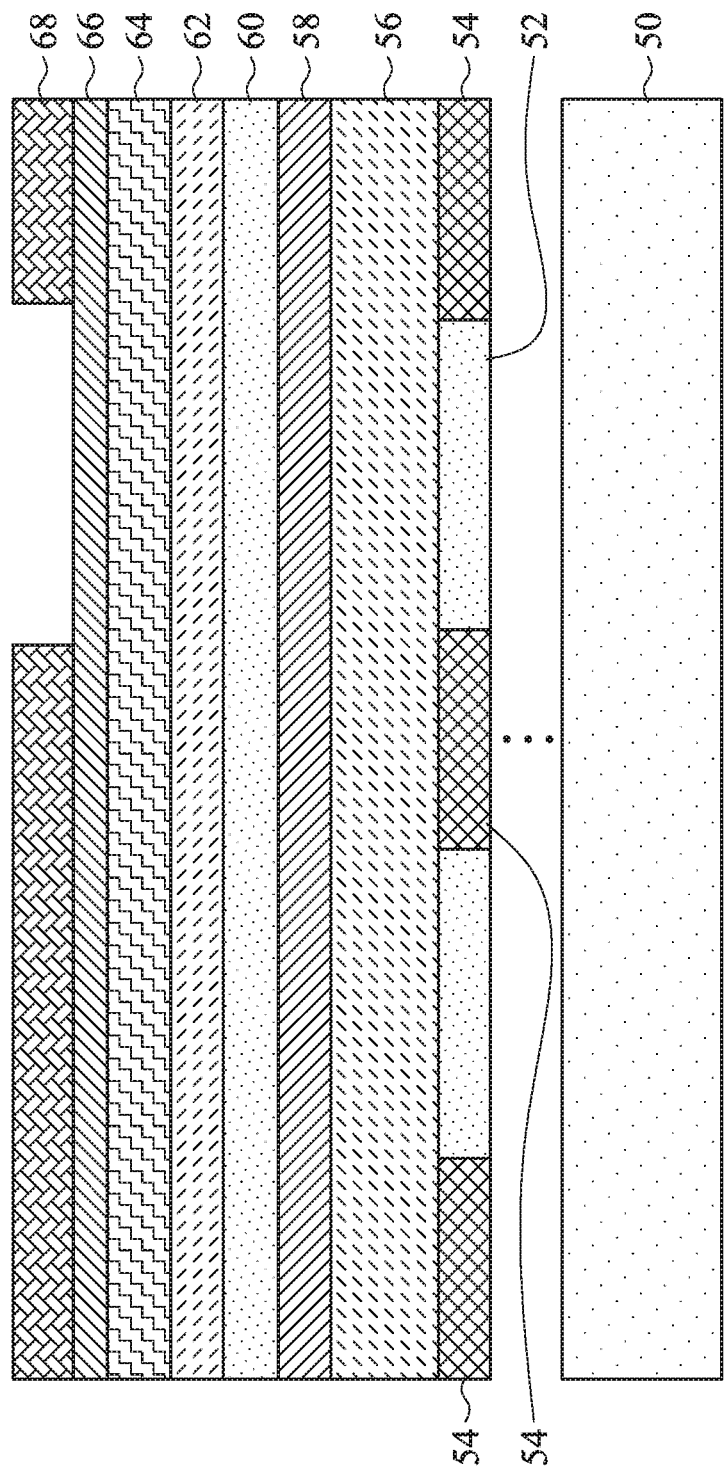
FIGS. 1 through 16 are cross-sectional views of respective intermediate structures during an example method for patterning during semiconductor processing in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate generally to one or more methods for forming a mask for patterning a feature in semiconductor processing. Generally, a layer can be implanted with a dopant species to alter the etch selectivity of the layer. The layer can be implanted and selectively etched, where non-implanted (e.g., un-doped) portions of the layer are removed, to form mask portions having a pattern that is subsequently transferred to one or more other layers. The implantation of the dopant species can include two implantation processes. A first implantation process can be a low-energy implantation of the dopant species, and a second, subsequent implantation process can be a high-energy implantation of the dopant species. It is believed that, by performing the low-energy implantation before the high-energy implantation, the dopant species implanted by the high-energy implantation may be better confined to a target region, which can permit sidewalls of the implanted region to be more vertical. The more vertical sidewalls of the implanted region can permit less variation in dimensions of the remaining implanted regions after the layer is etched by the etch process that selectively removes the non-implanted regions. Other advantages or benefits may also be achieved.

Some embodiments described herein are in the context of Back End Of the Line (BEOL) processing. Other processes and structures within the scope of other embodiments may be performed in other contexts, such as in Middle End Of the Line (MEOL) processing and other contexts. Various modifications are discussed with respect to disclosed embodiments; however, other modifications may be made to embodiments while remaining within the scope of the subject matter. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1 through 16 illustrate cross-sectional views of respective intermediate structures during an example method for patterning during semiconductor processing in accordance with some embodiments. FIG. 1 illustrates a first dielectric layer 52 over a semiconductor substrate 50. The semiconductor substrate 50 may be or include a bulk semiconductor, a semiconductor-on-insulator (SOI) substrate, or the like, which may be doped (e.g., with a p-type or an n-type dopant) or undoped. In some embodiments, the semiconductor material of the semiconductor substrate 50 may include elemental semiconductor like silicon (Si) and germanium (Ge); a compound semiconductor; an alloy semiconductor; or a combination thereof.

Various devices may be on and/or in the semiconductor substrate 50. For example, the semiconductor substrate 50 may include Field Effect Transistors (FETs), such as Fin FETs (FinFETs), planar FETs, vertical gate all around FETs (VGAA FETs), or the like; diodes; capacitors; inductors; and other devices. Devices may be formed wholly within the semiconductor substrate 50, in a portion of the semiconductor substrate 50 and a portion of one or more overlying layers, and/or wholly in one or more overlying layers, for example. Processing described herein may be used to form and/or to interconnect the devices to form an integrated circuit. The integrated circuit can be any circuit, such as for an Application Specific Integrated Circuit (ASIC), a processor, memory, or other circuit.

The first dielectric layer 52 is above the semiconductor substrate 50. The first dielectric layer 52 may be directly on the semiconductor substrate 50, or any number of other layers may be disposed between the first dielectric layer 52 and the semiconductor substrate 50. For example, the first dielectric layer 52 may be or include an Inter-Layer Dielectric (ILD) or an Inter-Metal Dielectric (IMD). The first dielectric layer 52, for example, may be or comprise a low-k dielectric having a k-value less than about 4.0. In some examples, the first dielectric layer 52 comprises phosphosilicate glass (PSG), borophosphosilicate glass (BPSG), fluorosilicate glass (FSG), $SiO_xC_y$, Spin-On-Glass, Spin-On-Polymers, silicon carbon material, a compound thereof, a composite thereof, or a combination thereof.

Conductive features 54 are in and/or through the first dielectric layer 52. The conductive features 54 may be or include a gate structure of a transistor, a contact plug to a gate structure of a transistor and/or to a source/drain region of a transistor, a conductive line and/or a conductive via. For example, the first dielectric layer 52 may include an ILD, and the conductive features 54 may include a gate electrode (e.g., tungsten, cobalt, etc.) in the ILD formed using a replacement gate process, for example. In another example, the first dielectric layer 52 may be an ILD, and the conductive features 54 may include a contact plug. The contact plug may be formed by forming an opening through the ILD to, for example, a gate electrode and/or source/drain region of a transistor formed on the semiconductor substrate 50. The contact plug can include an adhesion layer (e.g., Ti, etc.), a barrier layer (e.g., TiN, etc.) on the adhesion layer, and a conductive fill material (e.g., tungsten, cobalt, etc.) on the barrier layer. In yet another example, the first dielectric layer 52 may be an IMD, and the conductive features 54 may include a conductive line and/or a conductive via (collectively or individually, "interconnect structure"). The interconnect structure may be formed by forming an opening and/or recess through and/or in the IMD, for example, using a damascene process.

The first dielectric layer 52 and conductive features 54 are described in such a manner to illustrate various applications of methods described herein. In other examples, the conductive features 54 can be doped regions in the semiconductor substrate 50, such as source/drain regions of FETs, and the first dielectric layer 52 may be omitted since the conductive features 54 are in the semiconductor substrate 50. Methods described herein can be applied to patterning for any feature.

A second dielectric layer 56 is over the first dielectric layer 52 and the conductive features 54. For example, the second dielectric layer 56 may be or include an ILD or an IMD. The second dielectric layer 56 is deposited on the top surfaces of the first dielectric layer 52 and the conductive features 54. The second dielectric layer 56, for example, may be or comprise a low-k dielectric having a k-value less than about 4.0. In some examples, the second dielectric layer 56 comprises PSG, BPSG, FSG, $SiO_xC_y$, Spin-On-Glass, Spin-On-Polymers, silicon carbon material, a compound thereof, a composite thereof, or a combination thereof. The second dielectric layer 56 may be deposited using a Chemical Vapor Deposition (CVD), such as Plasma Enhanced CVD (PECVD) or Flowable CVD (FCVD); spin-on coating; or another deposition technique. In some examples, a Chemical Mechanical Planarization (CMP) or another planarization process may be performed to planarize the top surface of second dielectric layer 56. Although not illustrated, an etch stop layer may be over the first dielectric layer 52 and the conductive features 54 and below the second dielectric layer 56.

A mask stack is over the second dielectric layer 56. The mask stack includes a first mask sub-layer 58, a second mask sub-layer 60, and a third mask sub-layer 62. In other examples, the mask stack may be or include one layer or any number of different layers. The first mask sub-layer 58 is over the second dielectric layer 56. The second mask sub-layer 60 is over the first mask sub-layer 58. The third mask sub-layer 62 is over the second mask sub-layer 60.

The first mask sub-layer 58 may be or comprise a nitride layer, such as titanium nitride (TiN), silicon nitride (SiN), tantalum nitride (TaN), the like, or a combination thereof, and may be formed using CVD, Physical Vapor Deposition (PVD) Atomic Layer Deposition (ALD), or another deposition technique. The first mask sub-layer 58 can have a thickness in a range from about 20 nm to about 50 nm, for example.

The second mask sub-layer 60 may be or comprise an oxide deposited by PECVD (e.g., a PE-oxide). In some examples, the second mask sub-layer 60 may be an Anti-Reflective Coating (ARC), such as a Nitrogen-Free Anti-Reflective Coating (NFARC) (e.g., a silicon-rich oxide (SRO)), or the like. In other examples, the second mask sub-layer 60 can be another material and may be formed using CVD, PVD, ALD, or another deposition technique. The second mask sub-layer 60 can have a thickness in a range from about 10 nm to about 50 nm, for example.

The third mask sub-layer 62 may be or comprise a silicon layer, such as an amorphous silicon layer, the like, or a combination thereof. The third mask sub-layer 62 may be formed using CVD, PVD, ALD, or another deposition technique. The third mask sub-layer 62 can have a thickness in a range from about 20 nm to about 50 nm, such as about 25 nm, for example.

A bottom layer 64 (e.g., a sacrificial layer) is over the third mask sub-layer 62. The bottom layer 64 may be or comprise a hard mask material, such as a carbon-containing material, and may be formed using spin-on coating, CVD, PVD, ALD, or another deposition technique. In an example, the bottom layer 64 is a polymer material, such as an oxide, formed by spin-on coating. In some examples, the bottom layer 64 may be planarized after being deposited, such as by CMP or another planarization process. The bottom layer 64 can have a thickness in a range from about 20 nm to about 150 nm, for example.

A middle layer 66 (e.g., a sacrificial layer) is over the bottom layer 64. The middle layer 66 may be or comprise another mask material, such as a carbon-containing material like silicon oxycarbide (SiOC), and may be formed using CVD, PVD, ALD, or another deposition technique. In an example, the middle layer 66 is SiOC. The middle layer 66 can have a thickness in a range from about 10 nm to about 40 nm, for example.

A photo resist 68 is over the middle layer 66, such as by using spin-on coating, and is patterned by exposing the photo resist 68 to light using an appropriate photomask. Exposed or unexposed portions of the photo resist 68 may then be removed depending on whether a positive or negative resist is used. An area where a portion of the photo resist 68 was removed forms an area that exposes a corresponding portion of the middle layer 66 where a hard mask is to be formed.

Figure 2:
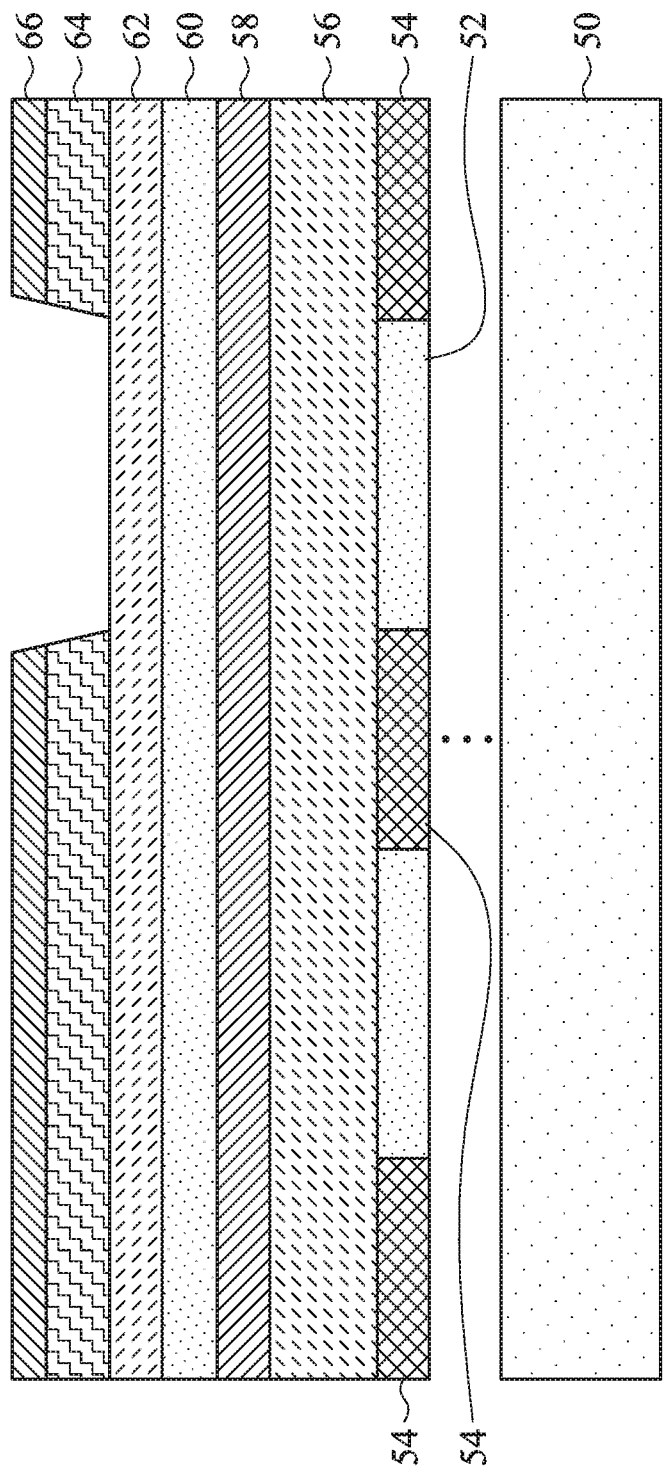

FIG. 2 illustrates transferring the pattern of the patterned photo resist 68 to the middle layer 66 and the bottom layer 64. The pattern of the photo resist 68 can be transferred by an etch process, such as a dry (e.g., plasma) etch process, which may further be anisotropic. The etch process can be a reactive ion etch (RIE), neutral beam etch (NBE), the like, or another etch process. By transferring the pattern of the patterned photo resist 68 to the middle layer 66 and bottom layer 64, an area of the third mask sub-layer 62 is exposed through the middle layer 66 and bottom layer 64, which exposed area corresponds to the area of the middle layer 66 that was previously exposed by the patterned photo resist 68. Any remaining photo resist 68 after the etch process can be removed, such as by an ashing process.

Figure 3:
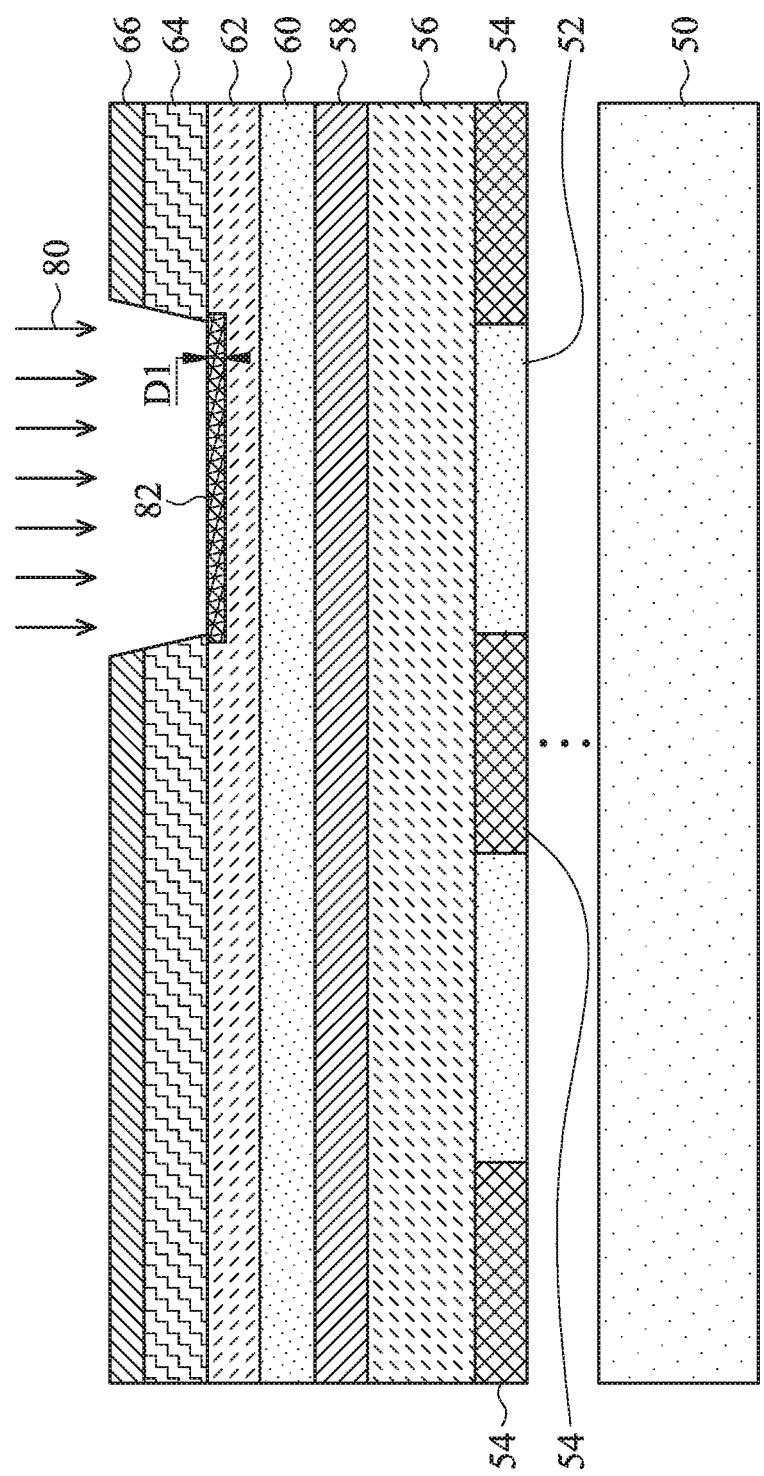

FIG. 3 illustrates a low-energy implant 80 performed to form a doped region 82 in the third mask sub-layer 62. The doped region 82 is formed in the third mask sub-layer 62 through the area of the third mask sub-layer 62 that is exposed through the middle layer 66 and bottom layer 64. The species that is implanted by the low-energy implant 80 confines at least some of a species that is subsequently implanted by a high-energy implant, as described subsequently. The species may further alter the material properties of the third mask sub-layer 62 in the doped region 82 where the species is implanted, such as altering an etch rate of the doped region 82 relative to the un-doped remainder of the third mask sub-layer 62 for a subsequent etch process.

In some examples, the low-energy implant 80 implants the species at an energy equal to or less than about 5 keV, such as in a range from about 1 keV to about 5 keV. In some examples, the species can be implanted by the low-energy implant 80 to form the doped region 82 to a first depth D1 in a range from about 3 nm to about 4 nm. In some examples, the doped region 82 is doped by the low-energy implant 80 to a concentration greater than about $1\times10^{20}$ cm$^{-3}$, such as in a range from about $1\times10^{20}$ cm$^{-3}$ to about $5\times10^{20}$ cm$^{-3}$, and more particularly, such as about $3\times10^{20}$ cm$^{-3}$. In some examples, the species implanted by the low-energy implant 80 includes boron, such as difluoroboron ($BF_2$). In other examples, different energies, depths, concentrations, and species may be implemented or used.

Figure 4:
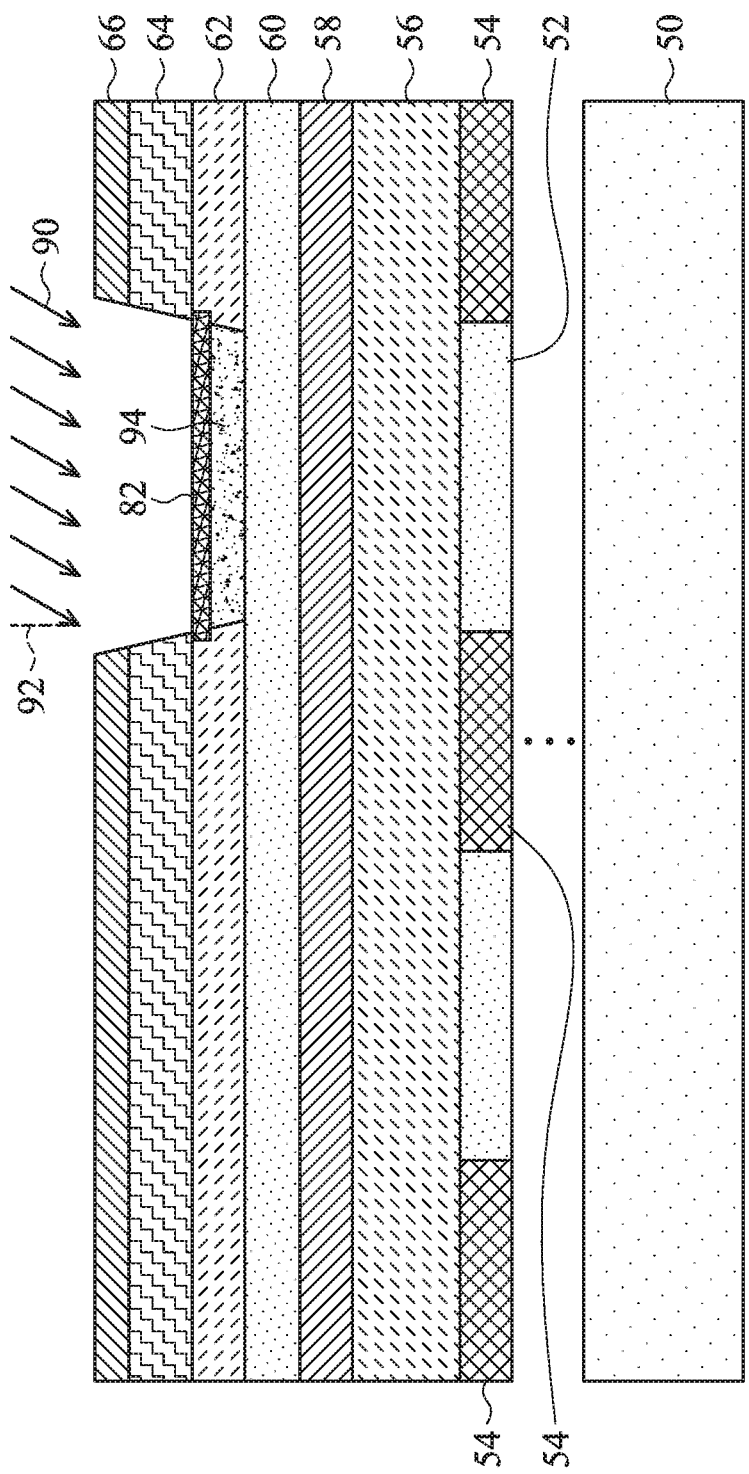
Figure 5:
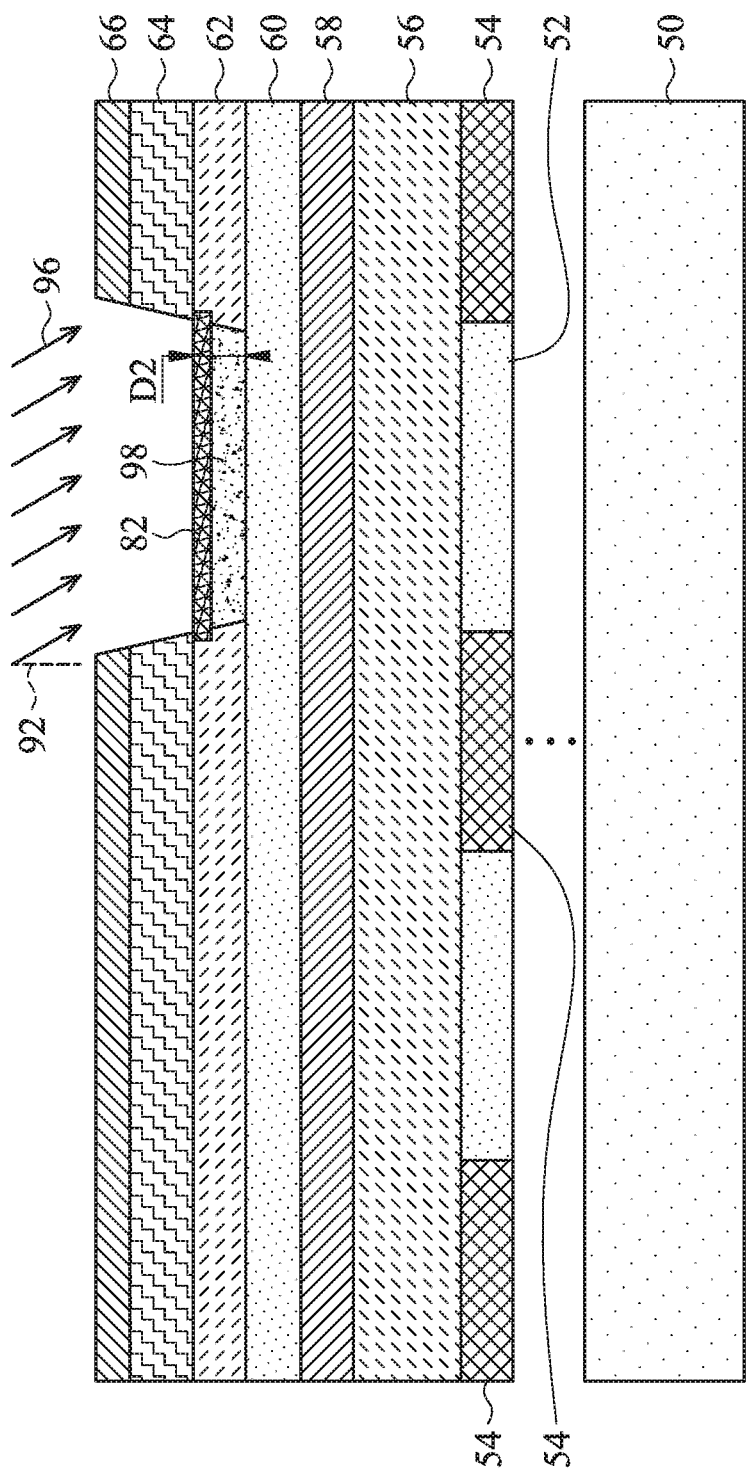

FIGS. 4 and 5 illustrate complementary high-energy tilted implants 90, 96 performed to form doped regions 94, 98, respectively, in the third mask sub-layer 62. The high-energy tilted implant 90 in FIG. 4 is performed at a first tilt angle with respect to vertical 92 (e.g., orthogonal from a major plane of the semiconductor substrate 50), and the high-energy tilted implant 96 in FIG. 5 is performed at a second tilt angle with respect to the vertical 92 that is complementary to the first tilt angle. In some examples, magnitudes of the first tilt angle and the second tilt angle can be in a range from about −20° to about 20°. For example, the first tilt angle can be 8°, and the second tilt angle can be −8°.

The doped region 94 is formed in the third mask sub-layer 62 through the area of the third mask sub-layer 62 that is exposed through the middle layer 66 and bottom layer 64 by the first high-energy tilted implant 90 of FIG. 4. The doped region 94 is formed by implanting a species through and/or in the doped region 82 formed by the low-energy implant of FIG. 3. Hence, the doped region 94 can overlap, at least in part, the doped region 82.

Similarly, the doped region 98 is formed in the third mask sub-layer 62 through the area of the third mask sub-layer 62 that is exposed through the middle layer 66 and bottom layer 64 after the second high-energy tilted implant 96 of FIG. 5. The doped region 98 is formed by implanting a species through and/or in the doped region 82 formed by the low-energy implant of FIG. 3 and at least partially in the doped region 94 formed by the first high-energy tilted implant 90 of FIG. 4. Hence, the doped region 98 can overlap, at least in part, the doped region 82 and includes the doped region 94.

The species implanted by the high-energy tilted implants 90, 96 may further alter the material properties of the third mask sub-layer 62 in the doped region 98 where the species is implanted, such as altering an etch rate of the doped region 98 relative to the un-doped remainder of the third mask sub-layer 62 for a subsequent etch process.

In some examples, each of the high-energy tilted implants 90, 96 implants the species at an energy equal to or greater than about 10 keV, such as in a range from about 10 keV to about 25 keV, such as about 18 keV. The energy of each of the high-energy tilted implants 90, 96 is greater than the energy of the low-energy implant 80. In some examples, the species can be implanted by the high-energy tilted implants 90, 96 to form the doped region 98 to a second depth D2 in a range from about 20 nm to about 50 nm. The second depth D2 may be greater than the first depth D1. The second depth D2 may be equal to or less than the thickness of the third mask sub-layer 62. In some examples, the doped region 98 is doped by the high-energy tilted implants 90, 96 to a concentration greater than or equal to about $1\times10^{19}$ cm$^{-3}$, such as in a range from about $1\times10^{19}$ cm$^{-3}$ to about $1\times10^{20}$ cm$^{-3}$, and more particularly, such as about $5\times10^{19}$ cm$^{-3}$. In some examples, the concentration of the doped region 98 can be less than, equal to, or greater than the concentration of the doped region 82 formed by the low-energy implant 80. In some particular examples, the concentration of the doped region 98 is less than the concentration of the doped region 82 formed by the low-energy implant 80. In some examples, the species implanted by the high-energy tilted implants 90, 96 includes boron, such as difluoroboron ($BF_2$). In other examples, different energies, depths, concentrations, and species may be implemented or used.

By implementing the low-energy implant 80 before the high-energy tilted implants 90, 96, the species implanted by the high-energy tilted implants 90, 96 can be better confined to the region of the third mask sub-layer 62 underlying the area of the third mask sub-layer 62 exposed through the middle layer 66 and bottom layer 64 during the high-energy tilted implants 90, 96. By confining the implanted species to this region more precisely, sidewalls of the doped region 98 can be formed to be more vertical, which can reduce variation of a dimension of the mask that is to be formed, as described subsequently. The inventors' empirical study suggests that the low-energy implant 80 can reduce scattering of the species implanted by the high-energy tilted implants 90, 96 that could otherwise occur without implementing the low-energy implant 80. Such scattering is believed to cause significant variation in sidewall profiles, which can cause significant variation in a dimension of a mask.

Figure 6:
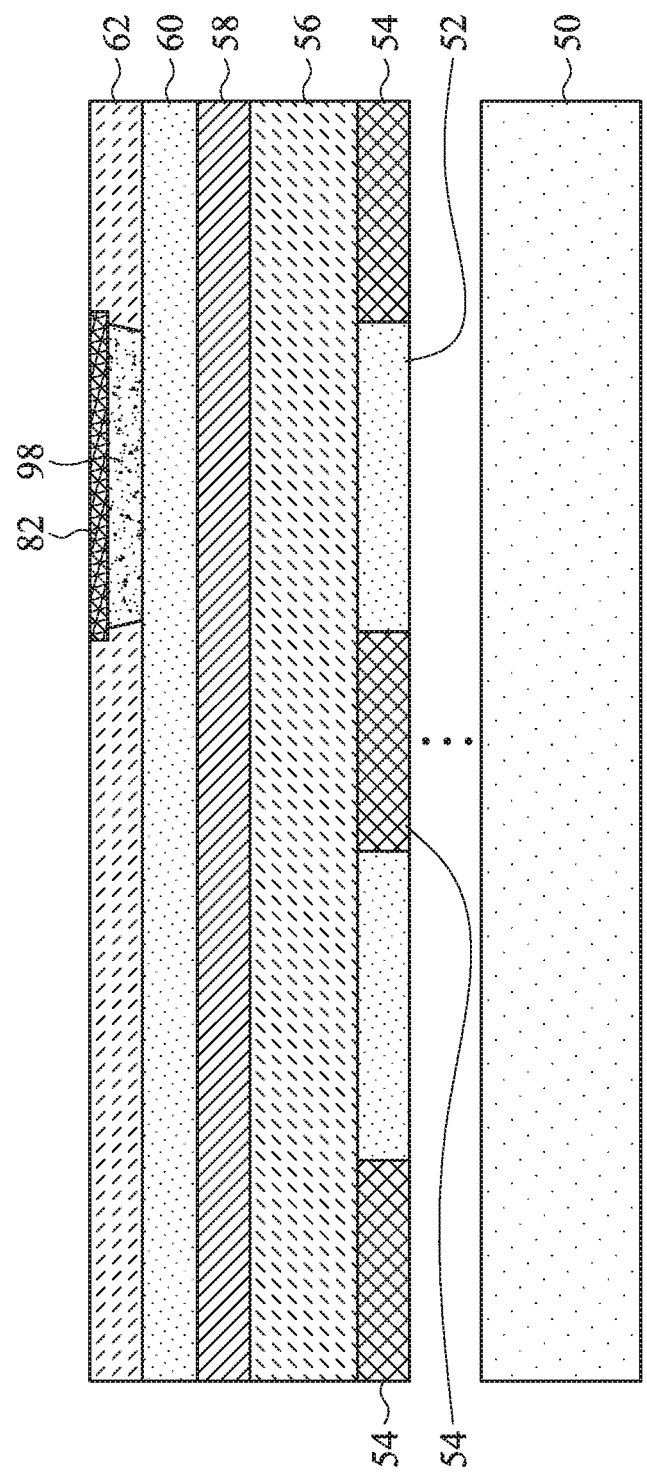

FIG. 6 illustrates the removal of the middle layer 66 and bottom layer 64. The middle layer 66 and bottom layer 64 can be removed by one or more etch processes selective to the materials of the middle layer 66 and bottom layer 64, for example.

FIGS. 7 through 12 illustrate processing similar to the processing described with respect to FIGS. 1 through 6 to form another doped region in the third mask sub-layer 62. By repeating this processing for another region of the third mask sub-layer 62, pitches may be reduced between features that are formed with the subsequently formed mask. This processing can be repeated any number of times to achieve any pattern for a mask that is subsequently formed. This repeated processing can be referred to as multiple patterning, such as double patterning. In some examples, this processing is not repeated, and FIGS. 7 through 12 can be omitted.

Figure 7:
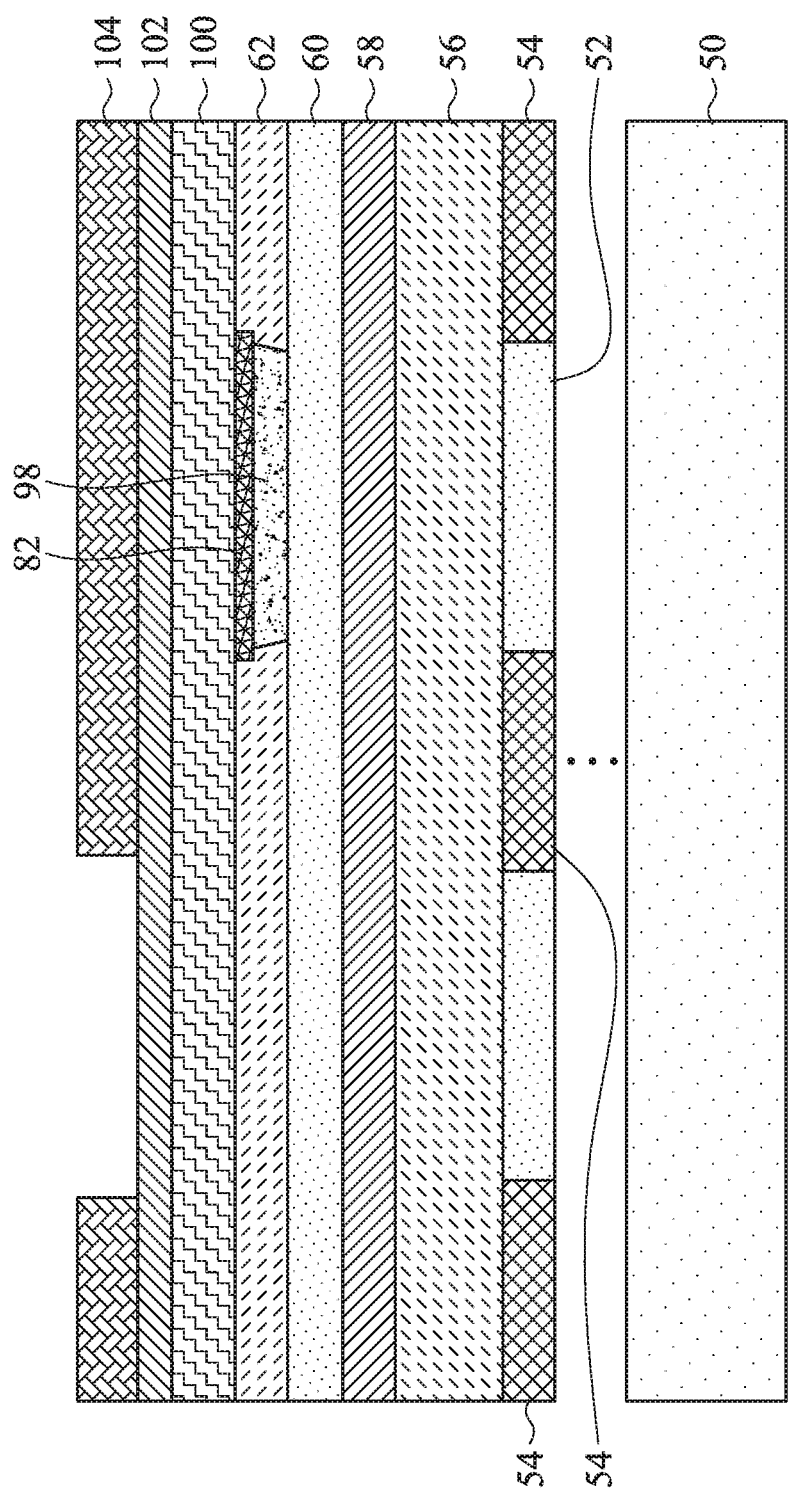

FIG. 7 illustrates the formation of a bottom layer 100 over the third mask sub-layer 62 (with the doped regions 82, 98), a middle layer 102 over the bottom layer 100, and a patterned photo resist 104 over the middle layer 102. The bottom layer 100, middle layer 102, and patterned photo resist 104 can be formed with the same or similar materials and by the same or similar processes as described above with respect to the bottom layer 64, middle layer 66, and patterned photo resist 68, respectively, with respect to FIG. 1. An area where a portion of the photo resist 104 was removed forms an area that exposes a corresponding portion of the middle layer 102 where a hard mask is to be formed.

Figure 8:
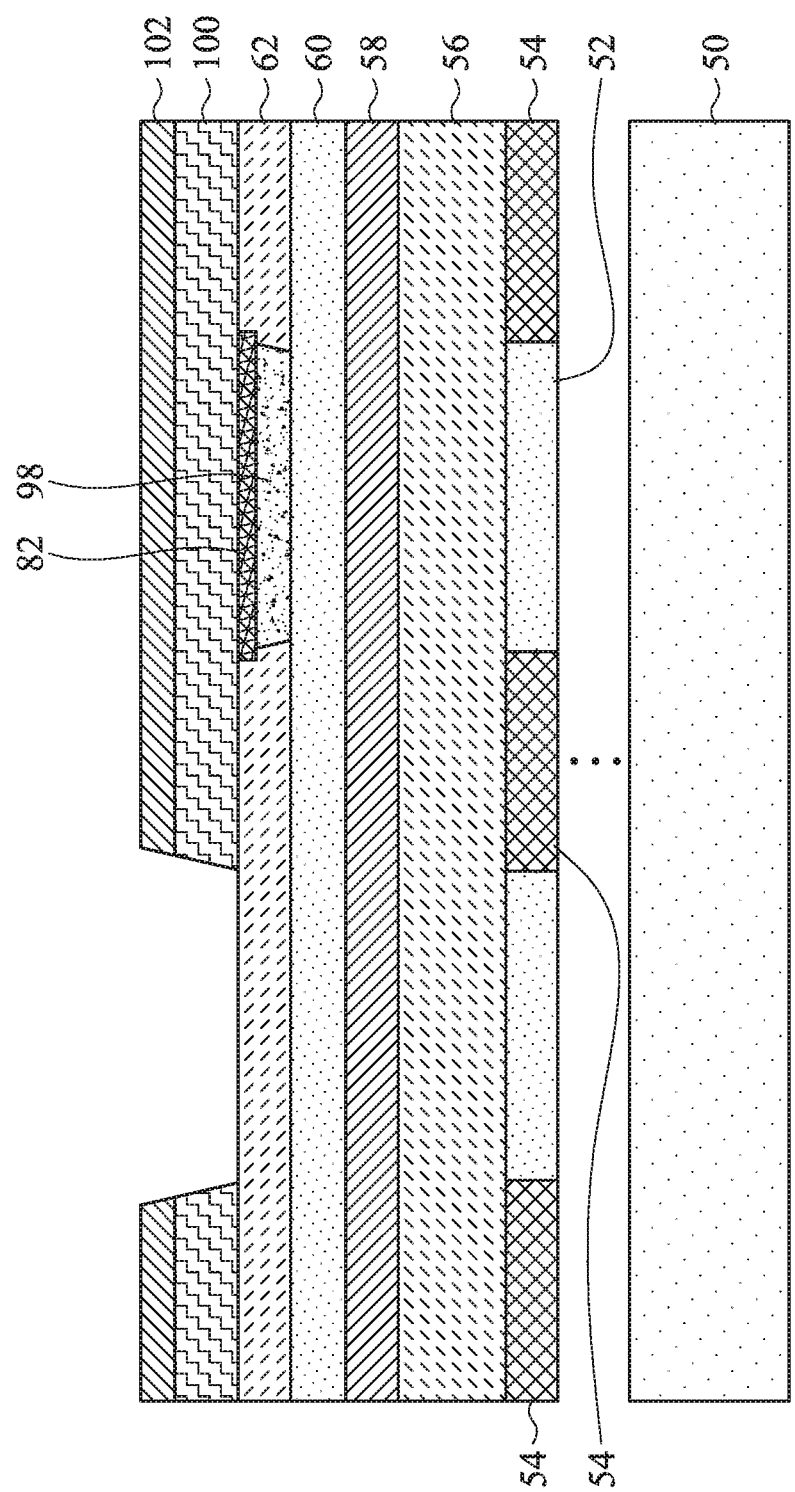

FIG. 8 illustrates transferring the pattern of the patterned photo resist 104 to the middle layer 102 and the bottom layer 100. Transferring the pattern may be performed as described above with respect to FIG. 2. By transferring the pattern of the patterned photo resist 104 to the middle layer 102 and bottom layer 100, an area of the third mask sub-layer 62 is exposed through the middle layer 102 and bottom layer 100, which exposed area corresponds to the area of the middle layer 102 that was previously exposed by the patterned photo resist 104. Any remaining photo resist 104 can be removed.

Figure 9:
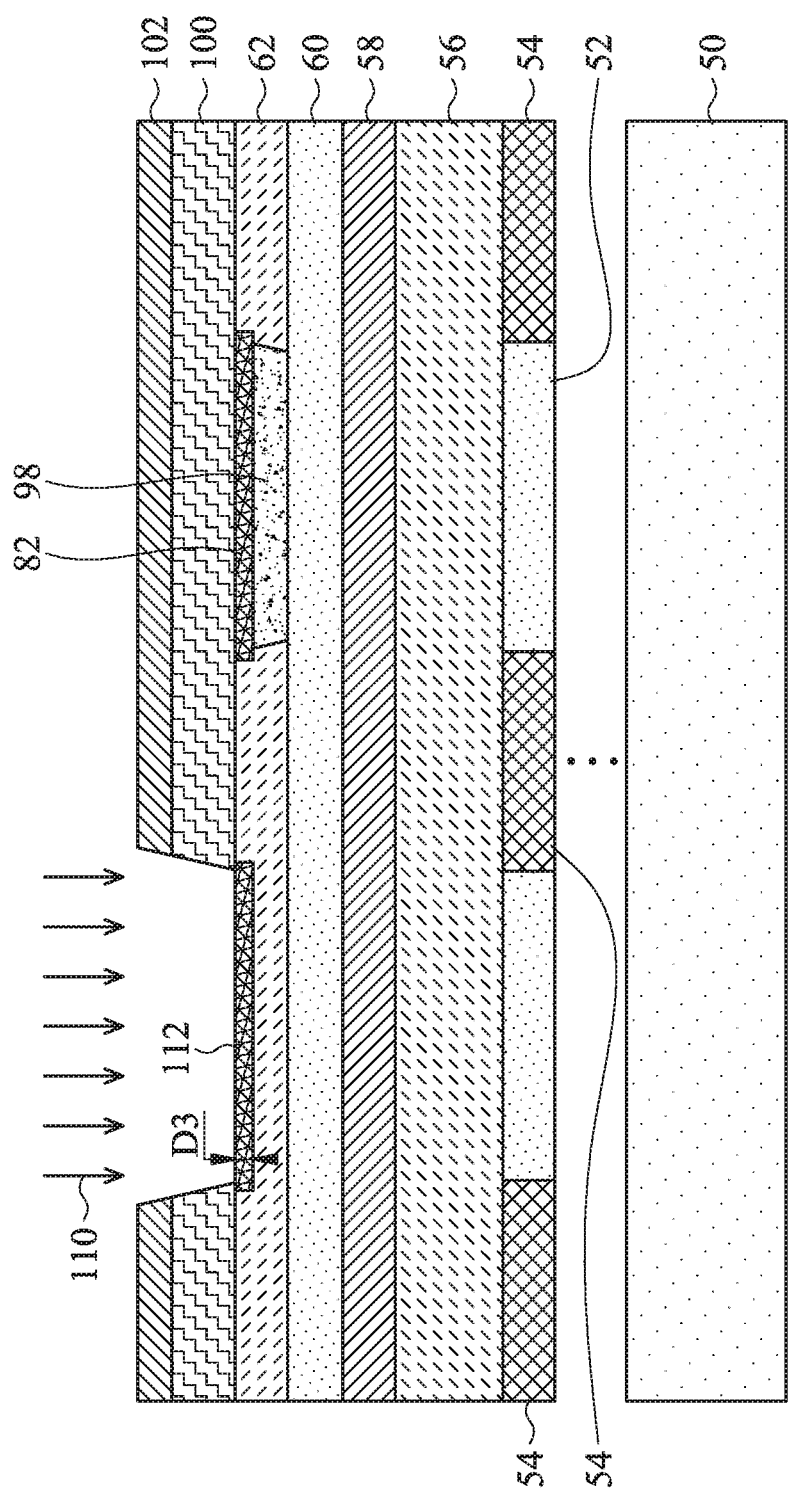

FIG. 9 illustrates a low-energy implant 110 performed to form a doped region 112 in the third mask sub-layer 62. The doped region 112 is formed in the third mask sub-layer 62 through the area of the third mask sub-layer 62 that is exposed through the middle layer 102 and bottom layer 100. The low-energy implant 110 can be performed the same as or similar to the low-energy implant 80 of FIG. 3, and hence, further description here is omitted for brevity. The species implanted by the low-energy implant 110 of FIG. 9 can be the same species as the species implanted by the low-energy implant 80 of FIG. 3.

Figure 10:
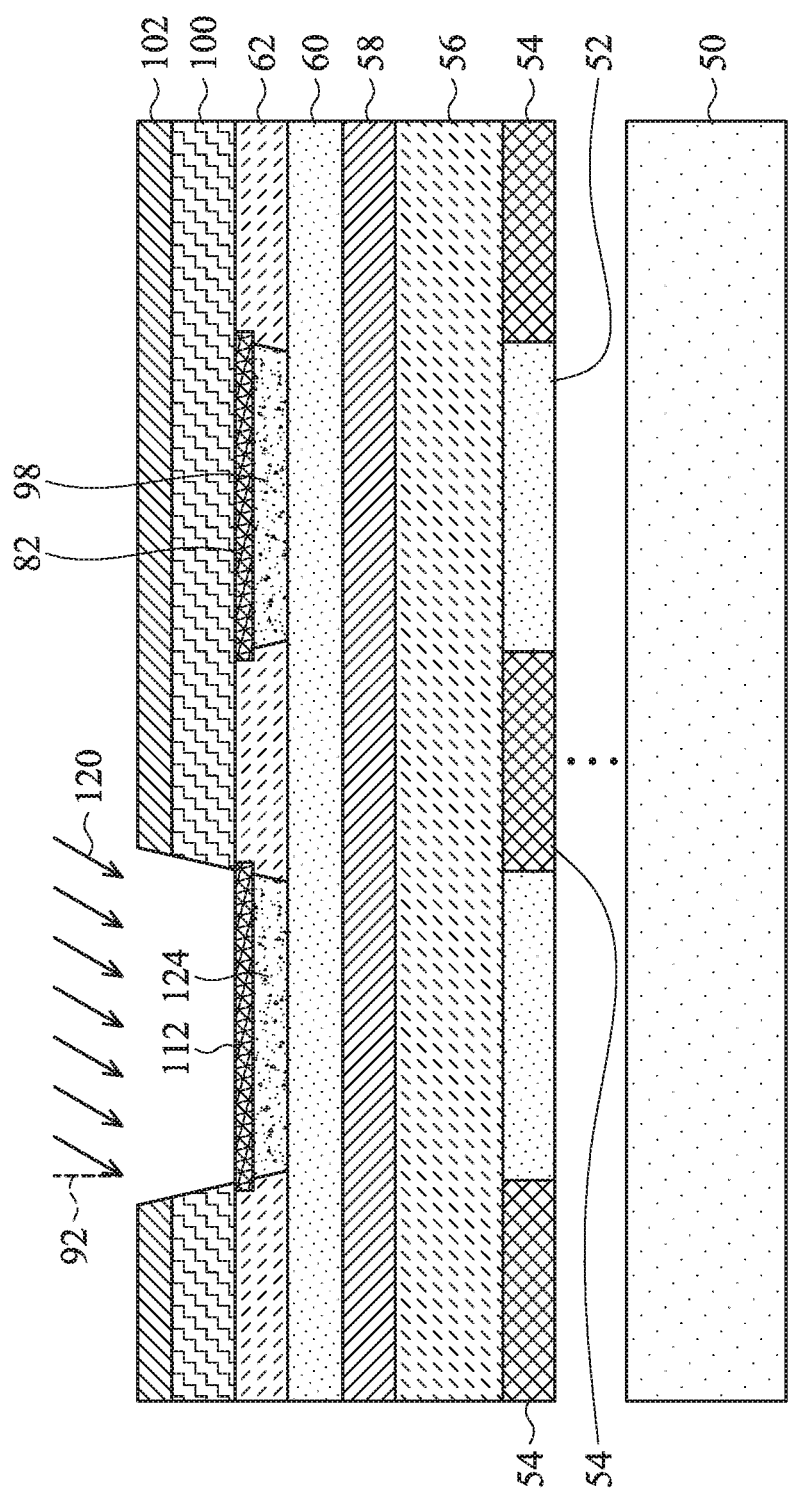
Figure 11:
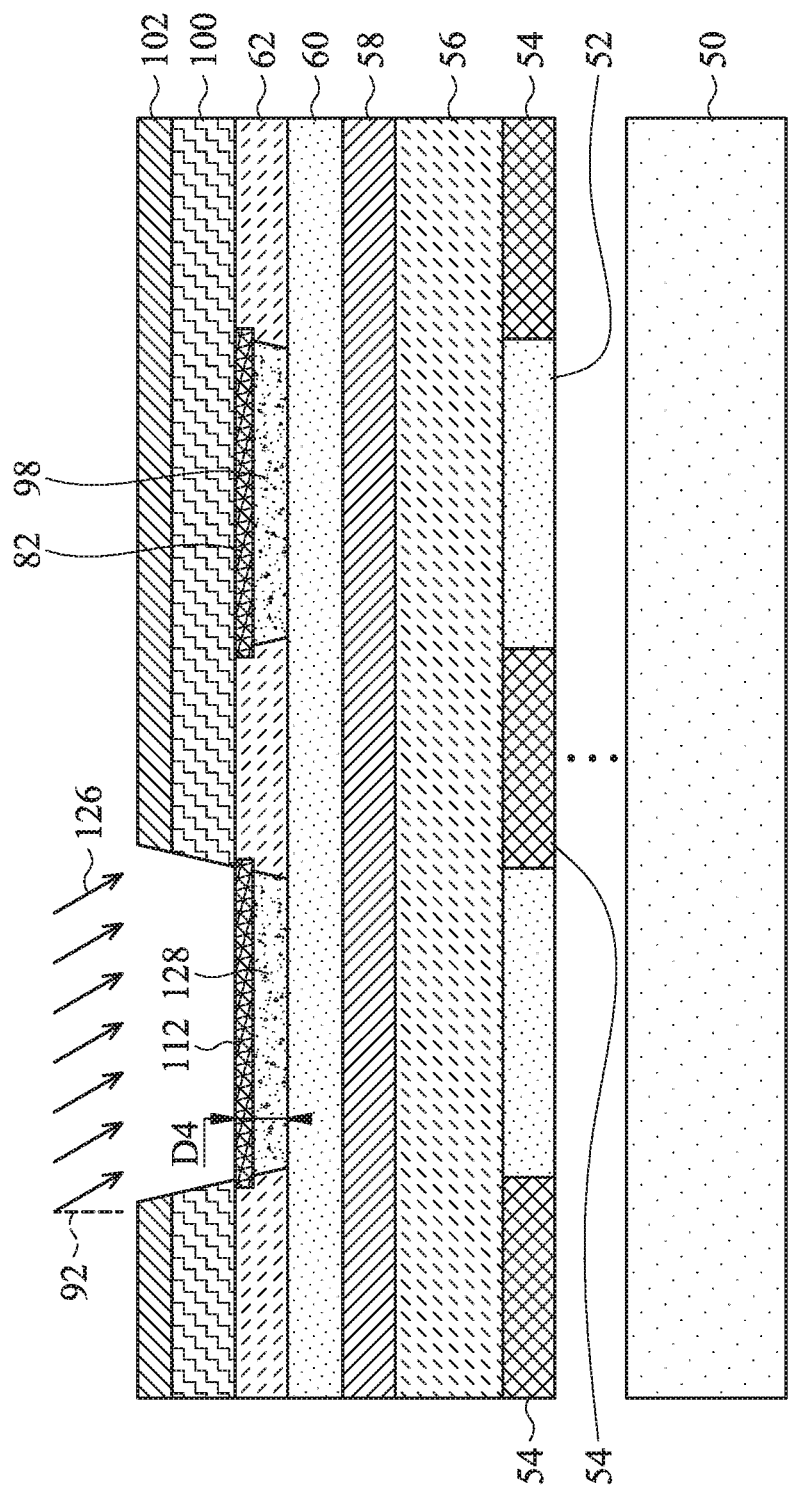

FIGS. 10 and 11 illustrate complementary high-energy tilted implants 120, 126 performed to form doped regions 124, 128, respectively, in the third mask sub-layer 62. The doped region 124 is formed in the third mask sub-layer 62 through the area of the third mask sub-layer 62 that is exposed through the middle layer 102 and bottom layer 100 by the first high-energy tilted implant 120 of FIG. 10. The doped region 124 is formed by implanting a species through and/or in the doped region 112 formed by the low-energy implant of FIG. 9. Hence, the doped region 124 can overlap, at least in part, the doped region 112. Similarly, the doped region 128 is formed in the third mask sub-layer 62 through the area of the third mask sub-layer 62 that is exposed through the middle layer 102 and bottom layer 100 after the second high-energy tilted implant 126 of FIG. 10. The doped region 128 is formed by implanting a species through and/or in the doped region 112 formed by the low-energy implant of FIG. 9 and at least partially in the doped region 124 formed by the first high-energy tilted implant 120 of FIG. 10. Hence, the doped region 128 can overlap, at least in part, the doped region 112 and includes the doped region 124. The high-energy tilted implants 120, 126 can be performed the same as or similar to the high-energy tilted implants 90, 96 of FIGS. 4 and 5, respectively, and hence, further description here is omitted for brevity. The species implanted by the high-energy tilted implants 120, 126 of FIGS. 10 and 11 can be the same species as the species implanted by the high-energy tilted implants 90, 96 of FIGS. 4 and 5, respectively.

Figure 12:
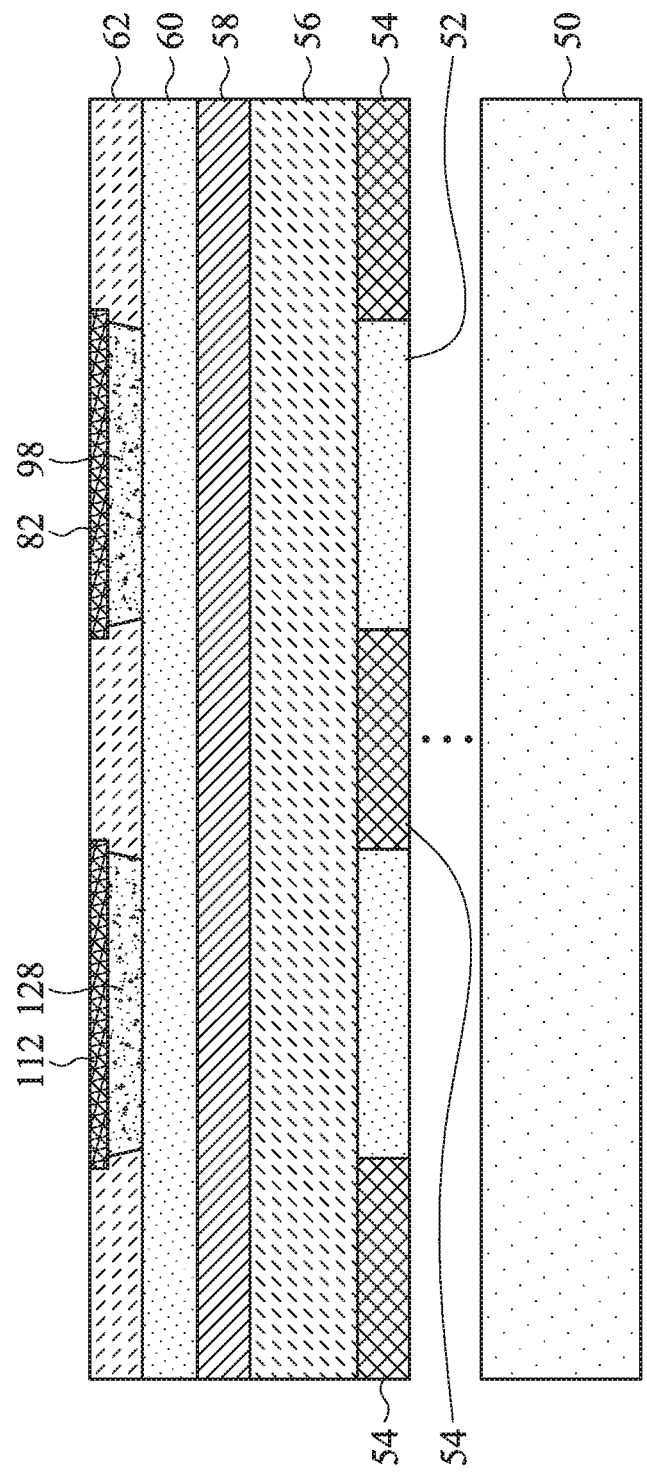

FIG. 12 illustrates the removal of the middle layer 102 and bottom layer 100. The middle layer 102 and bottom layer 100 can be removed by one or more etch processes selective to the materials of the middle layer 102 and bottom layer 100, for example.

Figure 13:
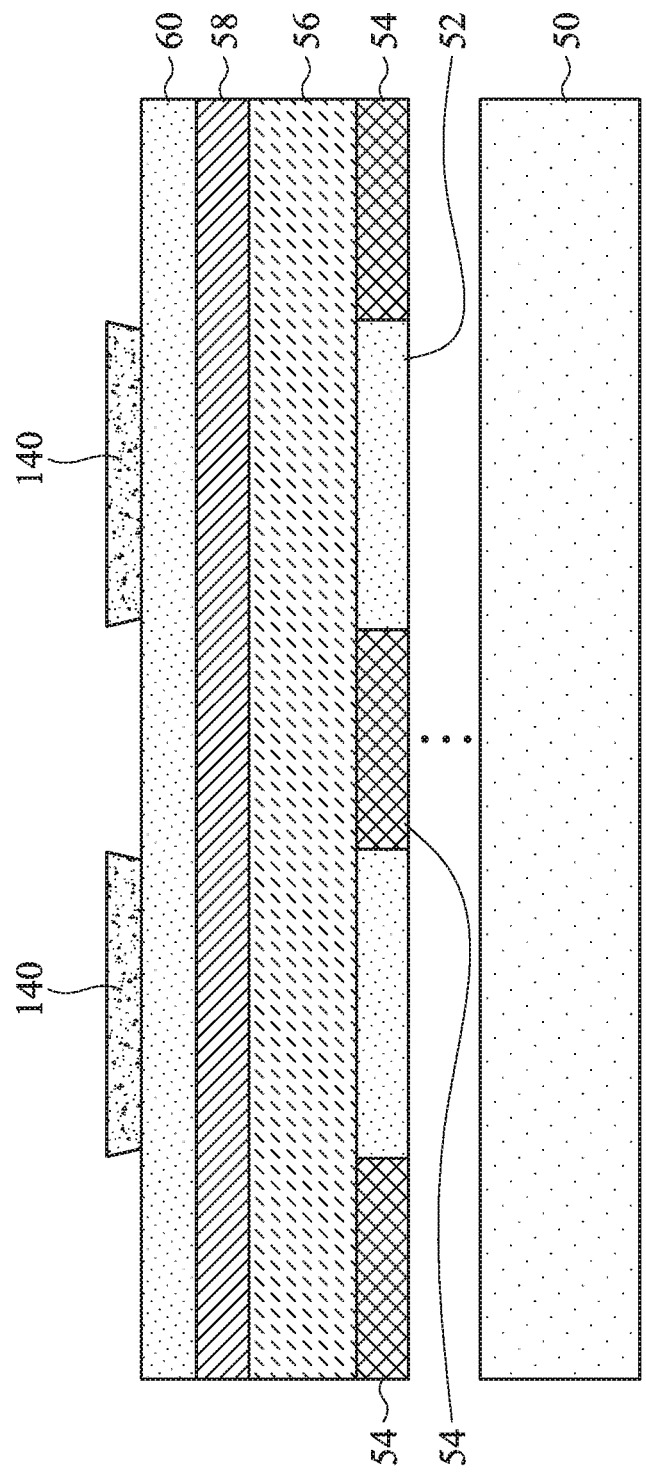

FIG. 13 illustrates removing un-doped portions of the third mask sub-layer 62 to form mask portions 140. An etch process that selectively etches the un-doped portions of the third mask sub-layer 62 at a greater rate than the doped regions 82, 98, 112, 128 is performed to remove the un-doped portions of the third mask sub-layer 62 while mask portions 140 corresponding to the doped regions 82, 98, 112, 128 remain. The etch process may result in some loss to the doped regions 82, 98, 112, 128 due to the etch process possibly etching those doped regions, albeit at a low etch rate. In some examples, the etch process is a wet etch, which may be isotropic. In some examples, a wet etch includes a solution including ammonium ($NH_4OH$) diluted in deionized water (DIW). The ammonium can be diluted in the DIW in a range from about 1:1 ($NH_4OH$:DIW by parts) to about 1:1000 ($NH_4OH$:DIW by parts). A temperature of the solution including the ammonium during the etch process can be in a range from about 25° C. to about 100° C. A duration of the etch process using the solution including the ammonium can be in a range from about 60 seconds to about 600 seconds. Other processes may be implemented to remove the un-doped portions of the third mask sub-layer 62 and form the mask portions 140.

Figure 14:
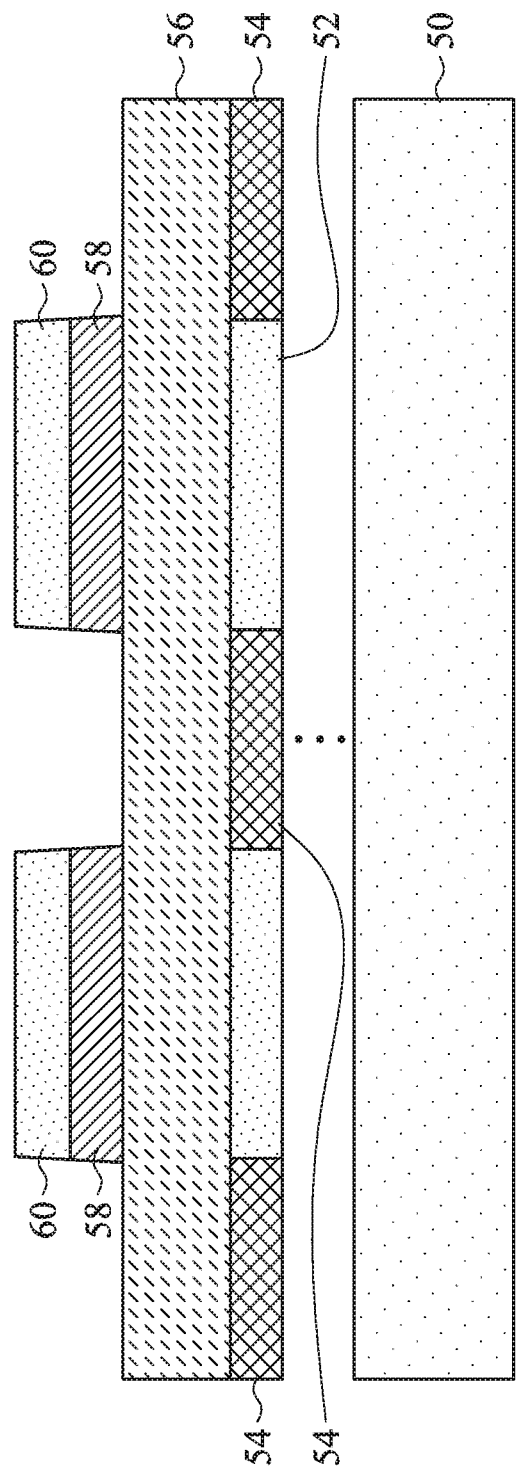

FIG. 14 illustrates transferring the pattern of the mask portions 140 to the second mask sub-layer 60 and first mask sub-layer 58. The patterned second and first mask sub-layers 60, 58 form a mask for subsequent patterning of the second dielectric layer 56. The transferring of the pattern to the second and first mask sub-layers 60, 58 may be performed by using one or more appropriate etch processes, such as an anisotropic (e.g., dry plasma) etch process. Example anisotropic etch processes include RIE, NBE, the like, or another etch process. As shown in FIG. 14, the mask portions 140 are removed. The mask portions 140 can be consumed during the transferring of the pattern and/or can be removed by subsequent etching.

Figure 15:
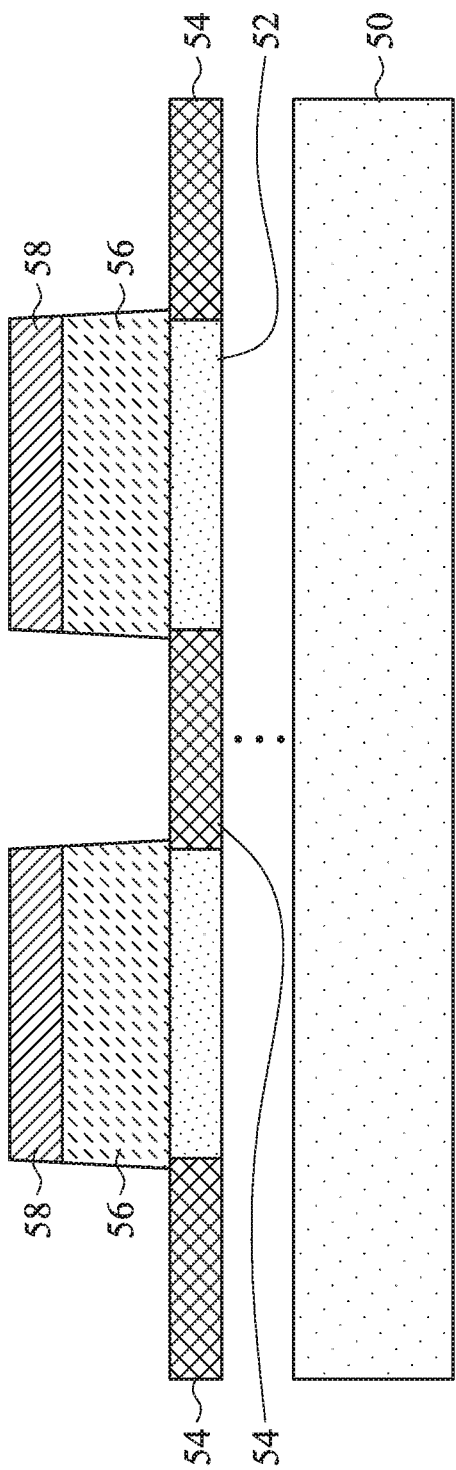

FIG. 15 illustrates using the mask formed by the second and first mask sub-layers 60, 58 to pattern the second dielectric layer 56. The patterning of the second dielectric layer 56 may be performed by using one or more appropriate etch processes, such as an anisotropic etch process. Example anisotropic etch processes include RIE, NBE, the like, or another etch process. As shown in FIG. 15, the second mask sub-layer 60 can be consumed during the patterning and/or can be removed by subsequent etching.

Figure 16:
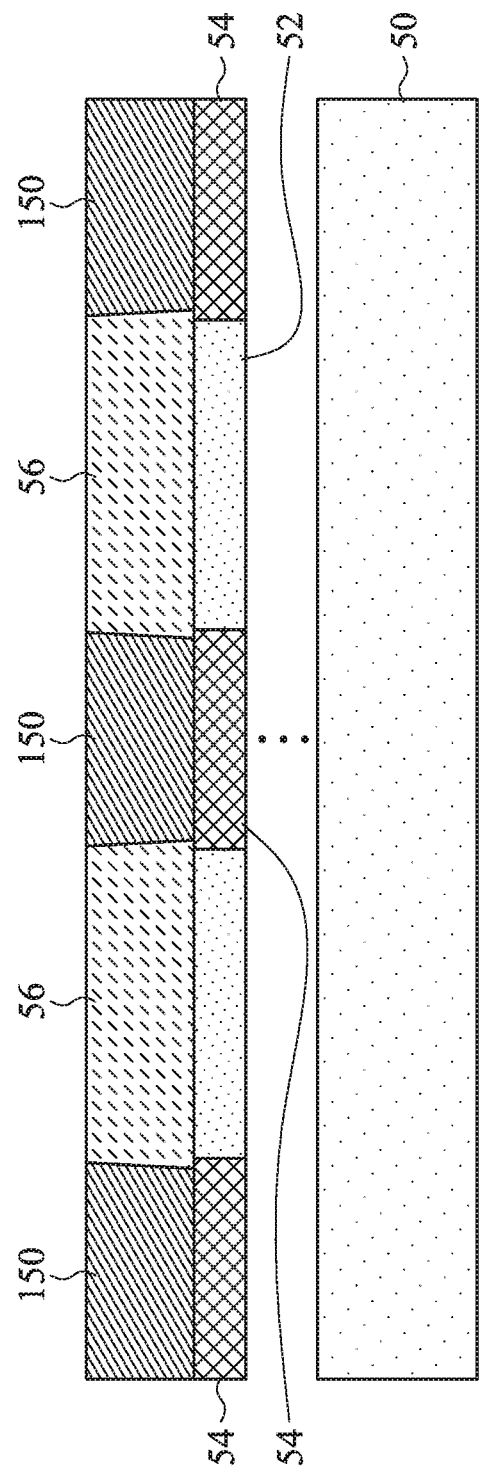

FIG. 16 illustrates the formation of conductive features 150 in the patterned second dielectric layer 56 and removal of the first mask sub-layer 58. The conductive features 150 may include, for example, a metal fill material in openings or recesses formed in the second dielectric layer 56 that are formed by the patterning of the second dielectric layer 56 described with respect to FIG. 15. Example metal fill material can include cobalt (Co), tungsten (W), copper (Cu), aluminum (Al), ruthenium (Ru), the like, or a combination thereof. The conductive features 150 can further comprise a barrier layer along sidewalls of the openings of the second dielectric layer 56, e.g., disposed between the second dielectric layer 56 and the metal fill material. The barrier layer can be or include titanium nitride, tantalum nitride, the like, or a combination thereof. Materials of the conductive features 150 can be deposited using any appropriate deposition process. Excess material of the conductive features 150 and the first mask sub-layer 58 can be removed by a planarization process, such as a CMP, which can form top surfaces of the conductive features 150 to be level with a top surface of the second dielectric layer 56. The conductive features 150 may be referred to as, e.g., contacts, vias, lines, pads, or the like.

Figure 17:
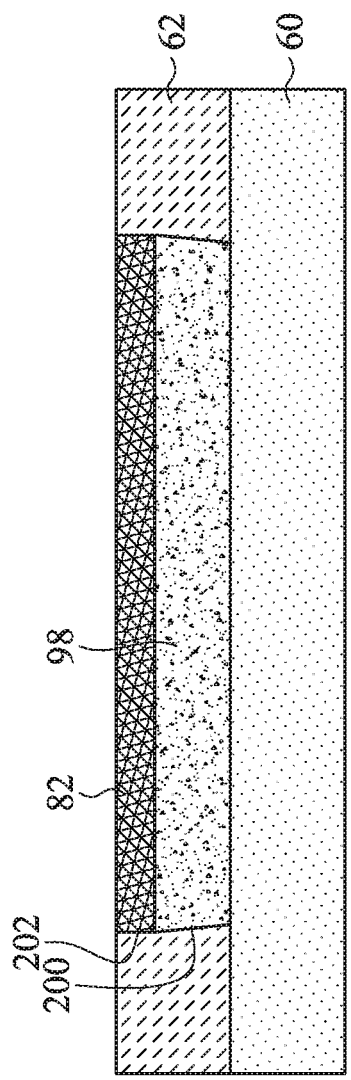
FIGS. 17 and 18 are cross-sectional views of respective intermediate structures to illustrate some effects of loss during the formation of mask portions in accordance with some embodiments.
Figure 18:
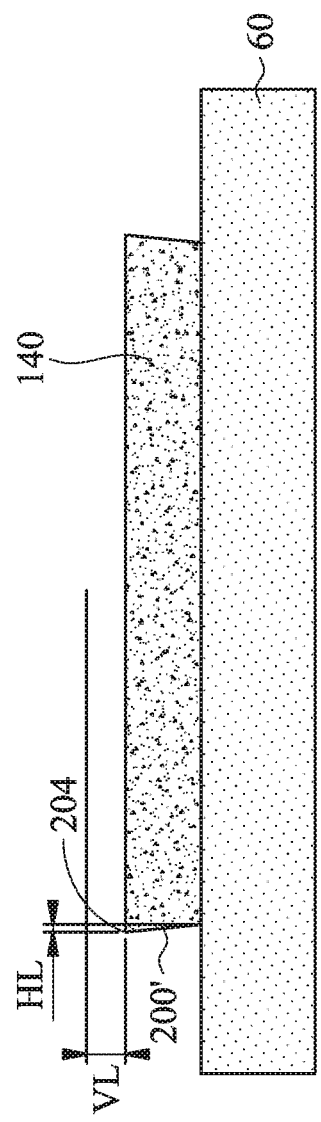

FIGS. 17 and 18 illustrate some effects of loss during the formation of the mask portions 140 in accordance with some embodiments. FIG. 17 illustrates the doped regions 82, 98 as formed in FIG. 6. FIG. 17 can similarly represent the doped regions 112, 128 as formed in FIG. 12. FIG. 18 illustrates a mask portion 140 as formed in FIG. 13.

In FIG. 17, the doped regions 82, 98 have a sidewall 200 with a lateral edge 202. The lateral edge 202 is a lateral boundary of the doped regions 82, 98 and is along the sidewall 200. As a person having ordinary skill in the art will readily understand, a dopant gradient may extend from the doped regions 82, 98 into the un-doped portions of the third mask sub-layer 62. The sidewall 200 is along a boundary of the doped regions 82, 98 where the concentration of the dopant is reduced and permits selective removal of the portions of the third mask sub-layer 62 outside of that boundary (e.g., the un-doped portions of the third mask sub-layer 62) while at least a portion of the doped regions 82, 98 remain as the mask portion 140. For example, where the species implanted into the doped regions 82, 98 is difluoroboron ($BF_2$), the third mask sub-layer 62 is amorphous silicon, and the etch process implemented to remove un-doped portions of the third mask sub-layer 62 is a wet etch process using diluted ammonium ($NH_4OH$), the sidewall 200 can be defined as a position along the dopant gradient where the dopant concentration transitions to less than about $1 \times 10^{19}$ cm$^{-3}$, which permits portions of the third mask sub-layer 62 having a concentration of the dopant less than that concentration to be selectively removed by the diluted ammonium. Hence, in such an example, the doped regions 82, 98 may each have a concentration greater than about $1 \times 10^{19}$ cm$^{-3}$.

In FIG. 18, after removing un-doped portions of the third mask sub-layer 62 to form the mask portion 140, the mask portion 140 has a sidewall 200' with a lateral edge 204. As illustrated, a vertical loss VL is experienced when the un-doped portions of the third mask sub-layer 62 are removed, such as by the etch process that removes the third mask sub-layer 62. The vertical loss VL can result in a horizontal loss HL, which corresponds to the lateral difference between the lateral edges 202 and 204.

By implementing the low-energy implant before the high-energy tilted implants, the species implanted by the high-energy tilted implants can be better confined to the region of the third mask sub-layer 62 underlying the area of the third mask sub-layer 62 exposed during the high-energy tilted implants. By confining the implanted species to this region more precisely, the sidewall 200 of the doped region 98 can be formed to be more vertical. The more vertical sidewall 200 can reduce the horizontal loss HL of the mask portion 140 when the vertical loss VL occurs. Hence, processing, such as critical dimensions for the formation of the conductive features 150, can be more precise. Some embodiments described herein may be implemented in any technology node, and more particularly, in advanced technology nodes.

An embodiment is a method for semiconductor processing. A dielectric layer is formed over a substrate. A mask is formed over the dielectric layer. Forming the mask includes depositing a first layer over the dielectric layer; implanting in a first implant process a dopant species through a patterned material and into the first layer at a first energy; after implanting in the first implant process, implanting in a second implant process the dopant species through the patterned material and into the first layer at a second energy greater than the first energy; and forming mask portions of the mask comprising selectively removing portions of the first layer that are not implanted with the dopant species.

Another embodiment is a method for semiconductor processing. A first layer is formed over a substrate. A first region of the first layer is implanted with a dopant species. The implanted first region has a first depth and a first concentration of the dopant species. A second region of the first layer is implanted with the dopant species through the implanted first region. The implanted second region has a second depth and a second concentration of the dopant species. The second depth is greater than the first depth. The first concentration is greater than the second concentration. The first layer is selectively etched to remove a third region of the first layer outside of the implanted first region and the implanted second region. At least a portion of the implanted first region and the implanted second region remains after the selective etching.

A further embodiment is a method for semiconductor processing. A dielectric layer is formed over a substrate. A multi-layer mask structure is formed over the dielectric layer. The multi-layer mask structure includes an upper layer. A patterned structure is formed over the multi-layer mask structure. The patterned structure exposes an area of the upper layer through an opening of the patterned structure. A dopant species is implanted through the opening and through the exposed area at a first implant energy into a first region of the upper layer. After implanting the dopant species at the first implant energy, the dopant species is implanted through the opening and through the exposed area at a second implant energy into a second region of the upper layer. The second implant energy is greater than the first implant energy. The upper layer is etched with an etchant. The etchant etches portions of the upper layer that do not contain the dopant species at a greater rate than the first region and the second region. A pattern of the etched upper layer is transferred to the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor processing, the method comprising:
   forming a dielectric layer over a substrate, the dielectric layer having a conductive region therein;

forming a mask layer over the dielectric layer;
forming a first patterned mask over the mask layer, the first patterned mask having a first opening exposing a first portion of the mask layer, the first patterned mask covering a second portion of the mask layer;
performing one or more species implant processes into the first portion of the mask layer;
removing the first patterned mask;
etching the second portion of the mask layer to form a second patterned mask, wherein an etch rate of the first portion is less than an etch rate of the second portion;
after removing the second portion, etching the dielectric layer using the second patterned mask as a mask to form a second opening; and
forming a conductive material in the second opening.

2. The method of claim 1, wherein the one or more species implant processes comprises:
a first species implant performed at a first implant angle; and
a second species implant performed at a second implant angle different than the first implant angle.

3. The method of claim 1, wherein the one or more species implant processes comprises:
a first species implant performed at a first implant energy; and
a second species implant performed at a second implant energy different than the first implant energy.

4. The method of claim 1, wherein the first portion extends completely through the mask layer.

5. The method of claim 1, wherein the mask layer comprises a plurality of sub-mask layers, wherein the first portion extends completely through an uppermost sub-mask layer of the plurality of sub-mask layers.

6. The method of claim 1, wherein performing the one or more species implant processes comprises:
performing a first implant to a first depth; and
performing a second implant to a second depth, wherein the first depth is less than the second depth, wherein etching the second portion of the mask layer comprises removing an upper region of the first portion, the upper region having a thickness of at least the first depth.

7. The method of claim 1, wherein the mask layer comprises amorphous silicon.

8. A method for semiconductor processing, the method comprising:
forming a dielectric layer over a substrate;
forming a multi-layer mask structure over the dielectric layer, the multi-layer mask structure comprising an upper layer;
forming a patterned mask over the upper layer, the patterned mask having a first opening exposing an exposed portion of the upper layer;
performing a first implant process to implant a first dopant species through the first opening and into the exposed portion of the upper layer;
after performing the first implant process, performing a second implant process to implant a second dopant species through the first opening and into the exposed portion, the first implant process and the second implant process having different process conditions;
after performing the second implant process, removing portions of the upper layer, wherein at least a portion of the exposed portion of the upper layer remains;
patterning the dielectric layer using the at least the portion of the exposed portion of the upper layer as a mask, wherein patterning the dielectric layer forms a recess in the dielectric layer; and
forming a first conductive feature in the recess.

9. The method of claim 8, wherein the dielectric layer has a second conductive feature therein, wherein the recess exposes the second conductive feature, and wherein the first conductive feature electrically contacts the second conductive feature.

10. The method of claim 8 further comprising:
performing a third implant process to implant a third dopant species through the first opening and into the exposed portion of the upper layer, wherein at least one first process condition is different between the first implant process and the second implant process, and at least one second process condition is different between the second implant process and the third implant process.

11. The method of claim 10, wherein the at least one first process condition includes implant energy or implant angle.

12. The method of claim 10, wherein the at least one second process condition includes implant energy.

13. The method of claim 8, wherein the first dopant species and the second dopant species are a same dopant species.

14. The method of claim 8, wherein the different process conditions comprise different implant energies.

15. The method of claim 8, wherein the different process conditions comprise different implant angles.

16. A method for semiconductor processing, the method comprising:
forming a target layer over a substrate;
forming a mask structure over the target layer, the mask structure comprising one or more masking layers, the one or more masking layers comprising an amorphous silicon layer;
forming a patterned mask over the amorphous silicon layer, the patterned mask having a first opening exposing an exposed portion of the amorphous silicon layer;
performing a first implant process at a first implant energy to implant a dopant species into the exposed portion of the amorphous silicon layer to form a first implant region;
performing a second implant process at a second implant energy to implant the dopant species into the exposed portion of amorphous silicon layer to form a second implant region, the second implant region having a greater depth than the first implant region, the first implant energy being less than the second implant energy;
removing portions of the amorphous silicon layer to expose portions of an underlying layer, wherein at least a portion of the second implant region remains; and
patterning the target layer using the at least a portion of the second implant region as a mask.

17. The method of claim 16, wherein the target layer comprises a dielectric layer, wherein patterning the target layer forms a recess, and further comprising forming a first conductive feature in the recess.

18. The method of claim 16, wherein the dopant species comprises boron.

19. The method of claim 16, wherein the second implant process is performed at a different implant angle than the first implant process.

20. The method of claim 16, wherein a second depth of the second implant region is less than or equal to a thickness of the amorphous silicon layer.

* * * * *